United States Patent
Kanike

(10) Patent No.: US 8,377,763 B2
(45) Date of Patent: Feb. 19, 2013

(54) POLY RESISTOR AND METAL GATE FABRICATION AND STRUCTURE

(75) Inventor: Narasimhulu Kanike, Wayne, NJ (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 12/960,593

(22) Filed: Dec. 6, 2010

(65) Prior Publication Data

US 2012/0139049 A1 Jun. 7, 2012

(51) Int. Cl.
*H01L 21/00* (2006.01)
*H01L 21/84* (2006.01)
*H01L 27/01* (2006.01)
*H01L 21/12* (2006.01)
*H01L 31/0392* (2006.01)

(52) U.S. Cl. ........... 438/155; 257/350; 257/E21.616; 257/E27.035

(58) Field of Classification Search .......... 438/155; 257/350, E21.616, E27.035
See application file for complete search history.

(56) References Cited

U.S. PATENT DOCUMENTS

| | | | |
|---|---|---|---|
| 4,893,166 A | 1/1990 | Geekie | |
| 5,716,860 A | 2/1998 | Huang | |
| 6,232,194 B1 | 5/2001 | Yaung et al. | |
| 6,406,956 B1 | 6/2002 | Tsai et al. | |
| 7,034,653 B2 | 4/2006 | Bhattacharya et al. | |
| 2010/0019328 A1 | 1/2010 | Zhang et al. | |
| 2010/0019344 A1* | 1/2010 | Chuang et al. | 257/516 |
| 2010/0078645 A1 | 4/2010 | Kurz et al. | |
| 2010/0112764 A1 | 5/2010 | Mehrotra et al. | |
| 2011/0303982 A1* | 12/2011 | Chung et al. | 257/363 |

* cited by examiner

*Primary Examiner* — David S Blum
(74) *Attorney, Agent, or Firm* — Daryl K. Neff; H. Daniel Schnurmann

(57) ABSTRACT

A method is provided for fabricating a microelectronic device and a resistor on a substrate. The method can include forming device regions in a monocrystalline semiconductor region of a substrate, in which the device regions have edges defined according to a first semiconductor feature overlying a major surface of the semiconductor region. A dielectric region is formed having a planarized surface overlying the semiconductor region and overlying a second semiconductor feature disposed above a surface of an isolation region in the substrate. The surface of the isolation region can be disposed below the major surface. The method can further include removing at least a portion of the first semiconductor feature exposed at the planarized surface of the dielectric region to form an opening and forming a gate at least partially within the opening. Thereafter, further processing can include forming electrically conductive contacts extending through apertures in the dielectric region to the second semiconductor feature and the device regions, respectively. The step of forming electrically conductive contacts may include forming silicide regions contacting portions of the second semiconductor feature and the device regions, respectively. In such way, the method can define a resistor having a current path through the second semiconductor feature, and a microelectronic device including the gate and the device regions.

20 Claims, 10 Drawing Sheets

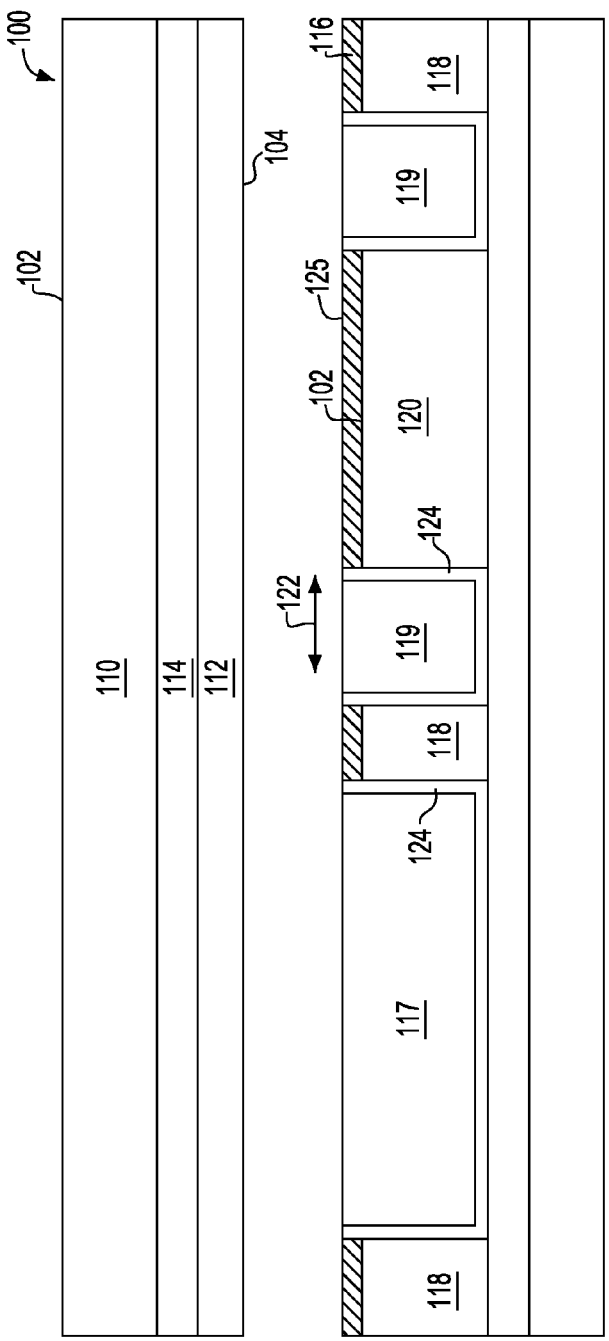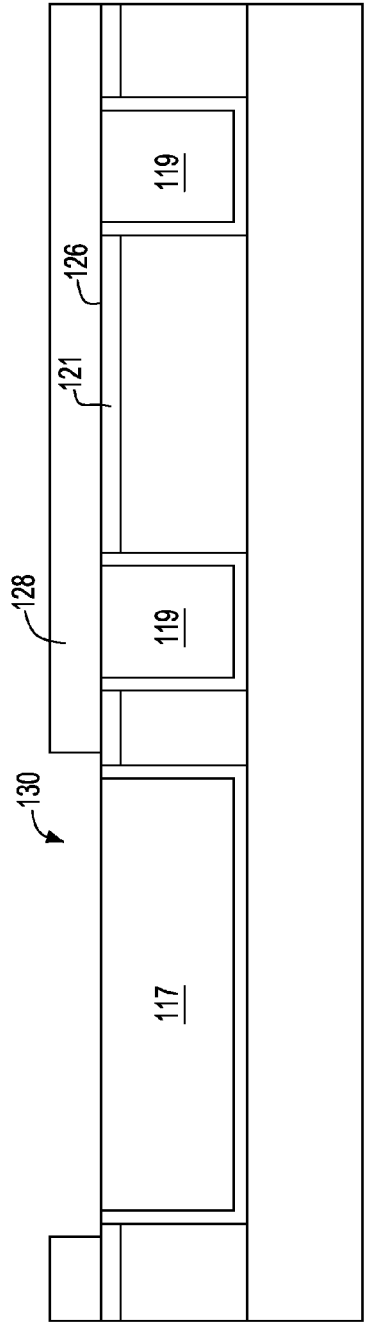

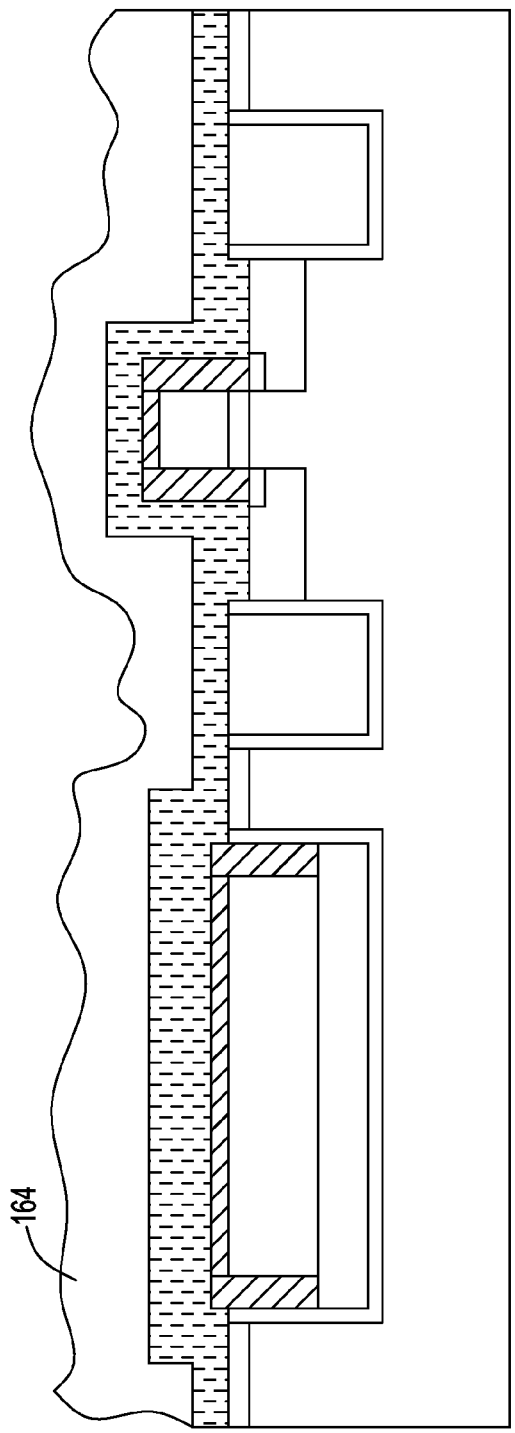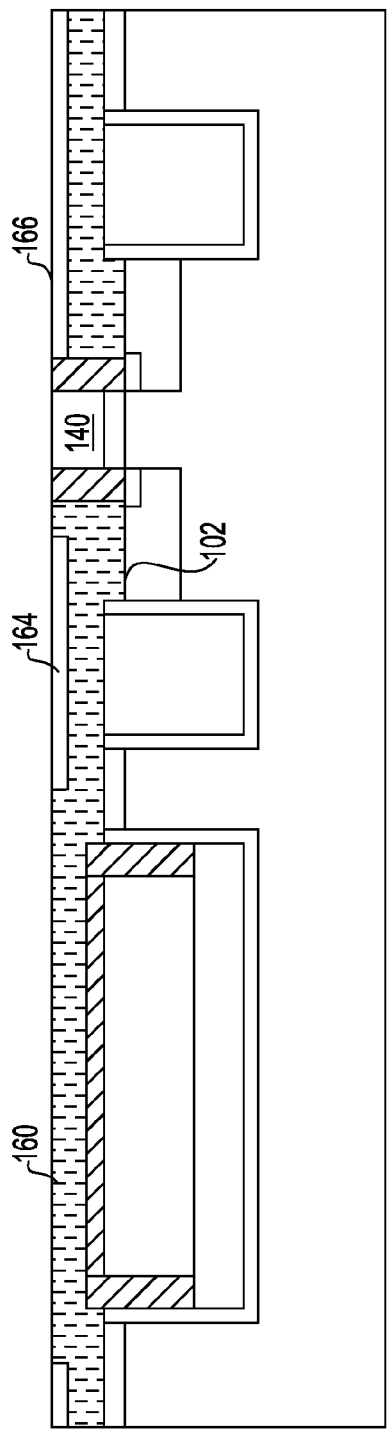

POLY RESISTOR AND METAL GATE FABRICATION AND STRUCTURE

BACKGROUND OF THE INVENTION

1. Field of the Invention

The subject matter of the present application relates to microelectronic devices and their manufacture, and more specifically to a method of fabricating a resistor and a microelectronic device on a semiconductor substrate, such as a resistor of polycrystalline semiconductor material and a field effect transistor.

2. Description of the Related Art

Microelectronic elements, e.g., semiconductor chips, typically include a large number of active semiconductor devices formed in one or more monocrystalline semiconductor regions of a substrate. The active semiconductor devices are interconnected via vias and metal wiring patterns disposed at one or more levels of a chip above the monocrystalline semiconductor regions.

Resistive elements are required to perform some functions of a microelectronic element. Such resistive elements can be implemented by on-chip semiconductor resistors. Sometimes, resistive elements can be implemented by transistors having terminals connected to one another to provide a predetermined resistance. However, for particular purposes it may be desirable to implement on-chip resistors as passive semiconductor regions having electrically conductive contacts thereto. It would be desirable to provide an improved method of fabricating such passive on-chip resistors and active semiconductor devices on a substrate.

SUMMARY OF THE INVENTION

A method is provided for fabricating a microelectronic device and a resistor on a substrate. The method can include forming device regions in a monocrystalline semiconductor region of a substrate, in which the device regions have edges defined according to a first semiconductor feature overlying a major surface of the semiconductor region. A dielectric region is formed having a planarized surface overlying the semiconductor region and overlying a second semiconductor feature disposed above a surface of an isolation region in the substrate. The surface of the isolation region can be disposed below the major surface. The method can further include removing at least a portion of the first semiconductor feature exposed at the planarized surface of the dielectric region to form an opening and forming a gate at least partially within the opening. Thereafter, further processing can include forming electrically conductive contacts extending through apertures in the dielectric region to the second semiconductor feature and the device regions, respectively. The step of forming electrically conductive contacts may include forming silicide regions contacting portions of the second semiconductor feature and the device regions, respectively. In such way, the method can define a resistor having a current path through the second semiconductor feature, and a microelectronic device including the gate and the device regions.

In accordance with an aspect of the invention, a method is provided for fabricating a field effect transistor and a resistor on a substrate. Such method can include: etching an isolation region exposed at a surface of a monocrystalline semiconductor region of a substrate to cause the isolation region to lie below the surface; depositing a semiconductor layer overlying the surface and overlying the isolation region; patterning the semiconductor layer to form a first semiconductor feature overlying the surface and a second semiconductor feature overlying the isolation region; forming source/drain regions in the semiconductor region, the source/drain regions having edges defined according to the first semiconductor feature; forming a first dielectric region having an at least substantially planar surface overlying the semiconductor region and overlying the second semiconductor feature; removing at least a portion of the first semiconductor feature exposed at the substantially planar surface to form an opening; forming a gate dielectric layer having a dielectric constant greater than four within the opening and forming a metal gate overlying the gate dielectric layer; forming a second dielectric region overlying the first dielectric region and the metal gate; and then forming electrically conductive contacts extending through apertures in the first and second dielectric regions to the source/drain regions and the second semiconductor feature, respectively, including forming silicide regions contacting the source/drain regions and portions of the second semiconductor feature, respectively, to define a field effect transistor including the metal gate, the source/drain regions and a channel below the metal gate, and a resistor having a current path through the second semiconductor feature.

In accordance with another aspect of the invention, a microelectronic element is provided which can include a substrate having a monocrystalline semiconductor region having a major surface and an isolation region separating portions of the semiconductor region exposed at the major surface from one another. The isolation region may have a top surface disposed below the major surface. A semiconductor feature overlies the top surface of the isolation region. A first dielectric region having an at least substantially planar surface may overlie the isolation region and have an opening extending from the at least substantially planar surface, the opening overlying the semiconductor region. A gate dielectric layer and a metal gate can be disposed within the opening. Source/drain regions can be disposed in the semiconductor region adjacent the metal gate. A second dielectric region may overlie the first dielectric region. Electrically conductive contacts may extend through apertures in the first and second dielectric regions to the semiconductor feature and the source/drain regions. The conductive contacts can include silicide regions contacting the source/drain regions and contacting the semiconductor feature, respectively. The silicide regions may have edges which are defined by edges of the apertures, wherein the semiconductor feature defines a resistor. The metal gate, the source/drain regions and a channel portion of the semiconductor region below the metal gate can define a field effect transistor.

BRIEF DESCRIPTION OF THE DRAWINGS

FIG. 1 is a sectional view depicting a substrate such as a semiconductor wafer which can serve as a starting structure in a fabrication method according to an embodiment of the invention.

FIG. 2 is a sectional view showing a stage in a fabrication method according to an embodiment of the invention after a plurality of isolation regions have been formed.

FIG. 3 is a sectional view showing a stage in a fabrication method according to an embodiment of the invention subsequent to the stage of FIG. 2 after patterning a resist mask with an opening exposing a particular isolation region.

FIG. 9 is a sectional view showing a stage in a fabrication method according to an embodiment of the invention subsequent to the stage of FIG. 8, after depositing a further dielectric layer.

FIG. 10 is a sectional view showing a stage in a fabrication method according to an embodiment of the invention subsequent to the stage of FIG. 9, after planarizing the structure to provide a dielectric region having a planarized surface, wherein at least a portion of a first semiconductor feature is exposed at the planarized surface.

DETAILED DESCRIPTION

Figure 4:
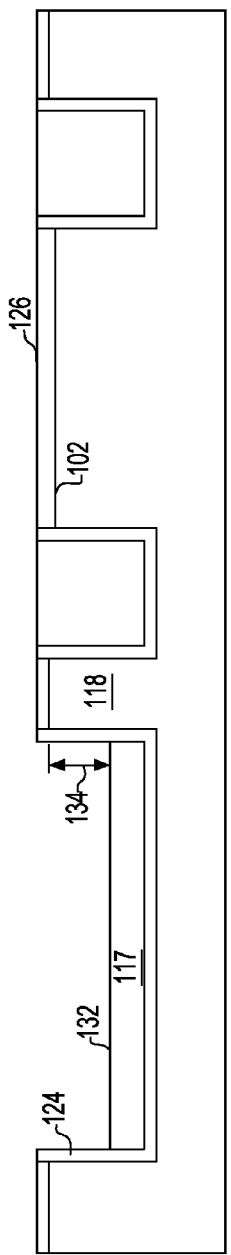
FIG. 4 is a sectional view showing a stage in a fabrication method according to an embodiment of the invention subsequent to the stage of FIG. 3 after recessing the particular isolation region to depth below the major surface of a semiconductor region of the substrate.

Accordingly, a method is provided for fabricating a microelectronic device and a resistor on a substrate in which one or more steps of the method are used in fabricating both the microelectronic device and the resistor. The resistor can include a portion of a semiconductor feature overlying a surface of an isolation region, wherein the surface of the isolation region is disposed below a major surface of a monocrystalline semiconductor region of a substrate. The semiconductor feature can be formed from a layer of semiconductor material from which another semiconductor feature is formed overlying the monocrystalline semiconductor region. The other semiconductor feature can be used to define edges of device regions in the monocrystalline semiconductor region. A dielectric region can then be formed having a planarized surface overlying the semiconductor feature for the resistor, after which the other semiconductor feature can be at least partially removed to form an opening in the dielectric region and a gate can be formed at least partially in the opening.

The method can include forming electrically conductive contacts extending through apertures in the dielectric region to the semiconductor feature and device regions of the microelectronic device. The step of forming the conductive contacts may include forming silicide regions which contact the semiconductor feature and the device regions after forming the apertures in the dielectric region. For example, the silicide regions can be formed by a self-aligned process of depositing a metal or a metal compound within the apertures in the dielectric region, heating the substrate to cause the metal or metal compound within the apertures to react with the semiconductor material of the semiconductor feature and the device regions, and then removing the unreacted metal from at least some portions of the substrate.

FIG. 1 is a sectional view illustrating a substrate such as a semiconductor wafer which can serve as a starting structure in a fabrication method according to an embodiment of the invention. A semiconductor wafer can consist essentially of semiconductor material between a major surface 102 and a rear surface 104 remote therefrom. Alternatively, as seen in FIG. 1, optionally a semiconductor wafer can be a silicon-on-insulator ("SOI") type wafer which includes a layer of monocrystalline semiconductor material 110 which is separated from a semiconductor layer 112 by a buried dielectric layer 114. The buried dielectric layer 114 typically includes a layer of silicon dioxide and the semiconductor layer 112 typically includes silicon, which can be in any of monocrystalline, polycrystalline or amorphous form.

FIG. 2 illustrates a stage in fabrication after a pad dielectric 116, e.g., a stack of a pad oxide layer and a pad silicon nitride layer has been formed atop the major surface 102, and a plurality of isolation regions 117, 119 have been formed which separate portions 118, 120 of the semiconductor region 110 (FIG. 1) in a lateral direction 122 along the major surface 102. For example, to form the isolation regions 117, 119, openings can be formed in the pad dielectric 116 to form a hard mask, and then such hard mask can be used in forming openings in the semiconductor region 110 (FIG. 1), such as by a dry etch process, e.g., an anisotropic etch process such as a reactive ion etch ("RIE") or certain plasma etch processes. The openings can extend to the buried dielectric layer 114. The buried dielectric layer 114 is omitted from figures showing subsequent stages in the fabrication method. However, it will be understood that the buried dielectric layer 114 can be present in each of the stages of fabrication, just as it can be present in the stage illustrated in FIG. 2.

Thereafter, a dielectric liner 124, which can be silicon nitride or silicon oxynitride, for example, can be formed which lines the openings, after which the remaining volume within the openings can be filled with silicon dioxide or other dielectric material to form the isolation regions 117, 119. Typically, the structure then is polished, such as by chemical mechanical polishing ("CMP") such that the structure appears as in FIG. 2, in which the pad dielectric 116 has an exposed surface 125 and the isolation regions 117, 119 have surfaces which are exposed at the surface 125 of the pad dielectric 116.

Thereafter, as seen in FIG. 3, the pad dielectric can be removed from atop the major surface of the semiconductor region, such as by wet etching processes, and then a layer 121 of silicon oxide can be grown on the major surface, such as by thermal processing. As an example, the oxide layer can have a thickness between 1.0 and 1.5 nanometers. The oxide layer can serve as an interfacial layer or sacrificial layer in subsequent processing. Then, a photoresist layer can be deposited thereon and patterned by photolithography to form a resist mask 128 which has an opening 130 in which the isolation region 117 is exposed, but which covers the other isolation regions 119. Then, the resist mask 128 is used in etching the isolation region 117 so as to recess a top surface 132 of the isolation region from its original location at (or near) the exposed surface 126 of the oxide layer 121 to a depth 134 (FIG. 4) below the major surface 102 of the monocrystalline semiconductor region. In one example, oxide material of the isolation region can be removed selectively with respect to nitride material of which the dielectric liner 124 can be made. In one embodiment, the isolation region 117 can be recessed a depth 134 of up to about 30 nanometers below the major surface 102 of the semiconductor region 118.

Figure 5A:
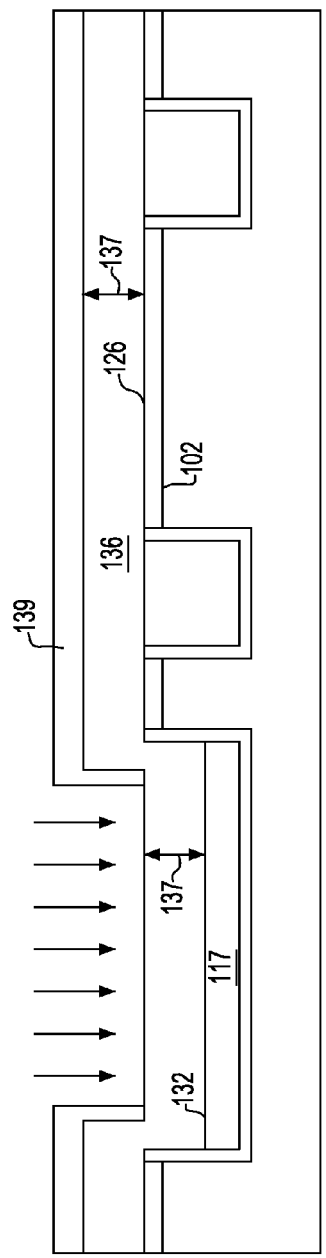
FIG. 5A is a sectional view showing a stage in a fabrication method according to an embodiment of the invention subsequent to the stage of FIG. 4, depicting an implantation of a layer of semiconductor material deposited to overlie the isolation region and the major surface of the substrate.
Figure 5B:
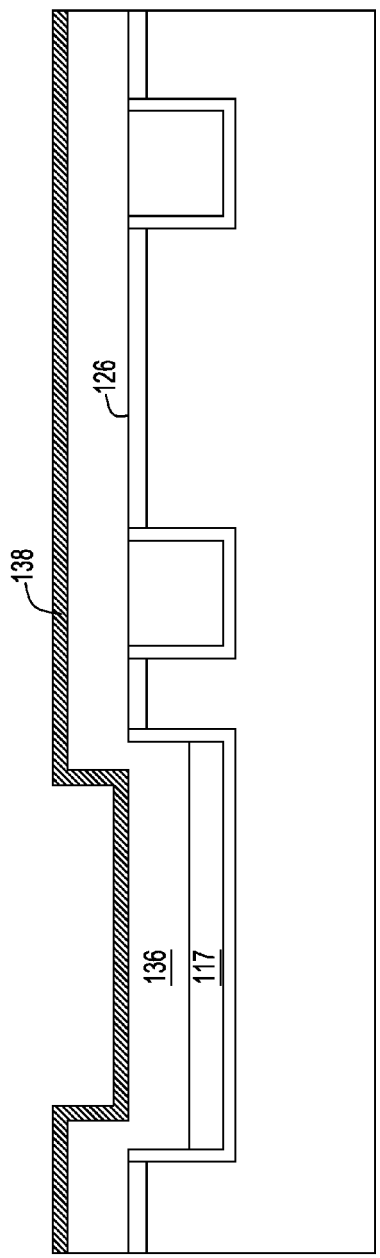
FIG. 5B is a sectional view showing a stage in a fabrication method according to an embodiment of the invention subsequent to the stage of FIG. 5A, or alternatively, subsequent to the stage depicted in FIG. 4.

Then, as seen in FIG. 5A, a semiconductor layer 136 is deposited to overlie the top surface 132 of the isolation region and the major surface 102 of the semiconductor region. The semiconductor layer 136 typically consists essentially of undoped polycrystalline semiconductor material such as polycrystalline silicon, i.e., "polysilicon". In one embodiment, the semiconductor layer 136 has a thickness 137 between 30 and 50 nanometers. Typically, the thickness 137 is the same or nearly the same above the isolation region 117 and above the oxide layer surface 126. In one example, the first and second semiconductor features can have the same thickness extending from the respective surfaces on which they are formed. Thereafter, a mask 139, e.g., a photoresist mask, is formed which has an opening through which a portion of the semiconductor layer overlying the isolation region 117 is exposed. Then, the exposed portion of the semiconductor layer is implanted with a dopant, e.g., phosphorus or boron, to a desired dopant concentration for using the implanted portion as a resistor. Thereafter, as seen in FIG. 5B, the mask can be removed and a dielectric cap layer 138 can be formed atop the semiconductor layer. By depositing an undoped polysilicon layer and then selectively implanting a portion of the polysilicon layer 136 which will be used as the resistor, it may facilitate the later removal of other (unimplanted) portions of the semiconductor layer 136 by wet etching processes.

Alternatively, the semiconductor layer 136 may be in situ doped, i.e., deposited under conditions such that it already has a desired dopant concentration for forming the resistor. In this case, the semiconductor layer 136 overlying the isolation region 117 and the oxide layer surface 126 in FIG. 5B has a dopant type and concentration established during the deposition process. In this case, because it will be used to form a resistor, the dopant concentration in the semiconductor layer is not expected to be very high, so as to facilitate later removal of the in situ doped semiconductor layer from other areas of the substrate surface.

Figure 6:
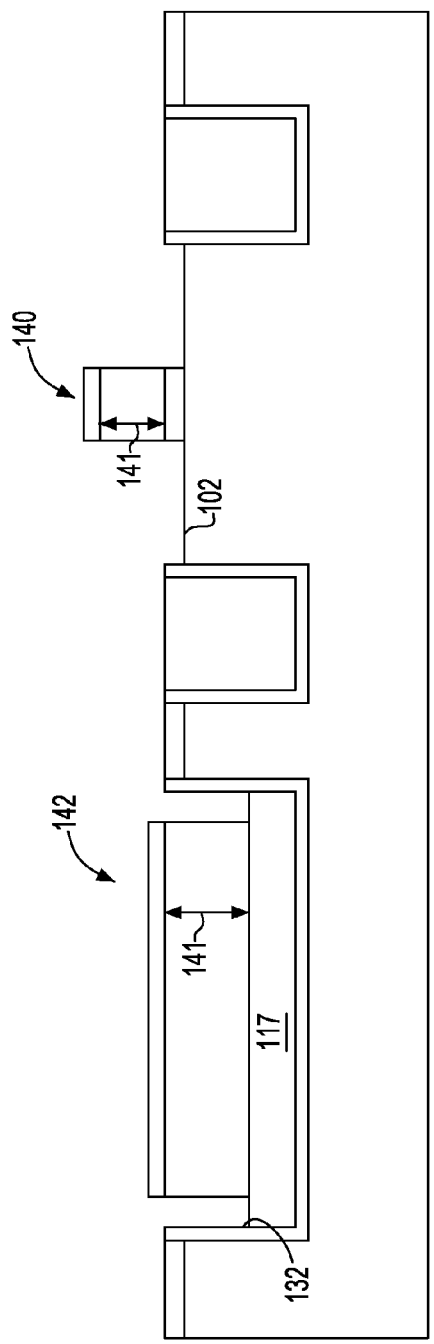
FIG. 6 is a sectional view showing a stage in a fabrication method according to an embodiment of the invention subsequent to the stage of FIG. 5B.

Thereafter, the semiconductor layer 136 and the dielectric cap layer 138 can be patterned to form the first semiconductor feature 140 overlying the major surface 102 of the semiconductor region and a second semiconductor feature 142 overlying the upper surface 132 of the isolation region, as seen in FIG. 6. In one example, when the resistor portion of the semiconductor layer 136 has been doped by an ion implantation process, the patterning can be performed by a wet etching process. Alternatively, in another example, when the semiconductor layer 136 (FIG. 5B) has been doped in situ, it can be patterned by a dry etching process such as a reactive ion etch or plasma etch process.

Figure 7:
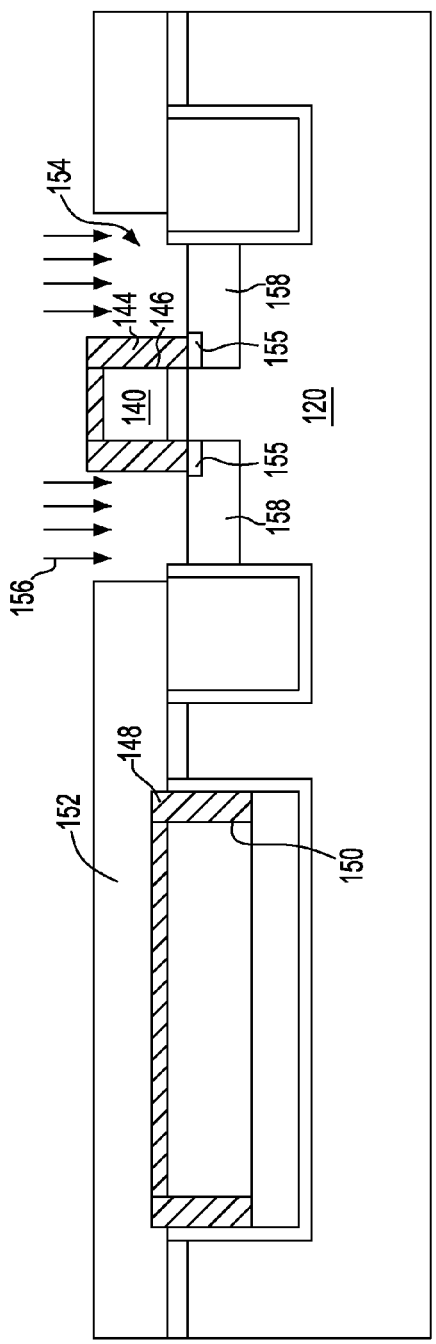
FIG. 7 is a sectional view showing a stage in a fabrication method according to an embodiment of the invention subsequent to the stage of FIG. 6, after dielectric spacers and device regions have been formed.

FIG. 7 shows a subsequent stage of fabrication in which dielectric spacers 144 are formed on edge surfaces 146 of the first semiconductor feature, and dielectric spacers 148 are also formed on the edge surfaces 150 of the second semiconductor feature. A resist mask 152 then can be formed which covers the structure except for an opening 154 in which portions of the semiconductor region 120 are exposed. Device regions such as halo and extension regions 155 in the semiconductor region 120 can be formed by ion implantation 156 having edges defined by locations of the edge surface 146 of the first semiconductor feature 140. Thereafter, other device regions such as source/drain regions 158 can be formed by an additional ion implantation, wherein again, edges of the source/drain regions 158 are defined in accordance with the edges 146 of the first semiconductor feature 140.

Figure 8:
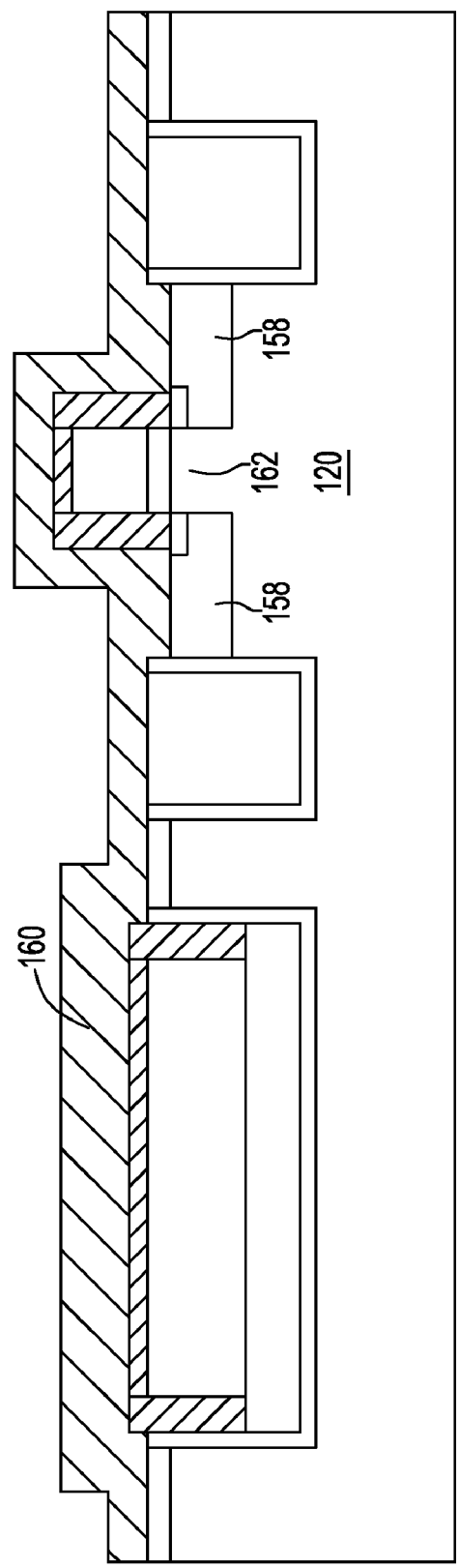
FIG. 8 is a sectional view showing a stage in a fabrication method according to an embodiment of the invention subsequent to the stage of FIG. 7, after forming a dielectric stressor layer.

Thereafter, as shown in FIG. 8, a dielectric stressor layer 160, which in one example, can consist essentially of silicon nitride, is deposited over the structure. The dielectric stressor layer 160 can be used to apply a beneficial stress to a channel region to be formed in a portion 162 of the semiconductor region 120 between the source/drain regions 158 to improve a performance of the microelectronic device. Depending upon the type of microelectronic device to be formed in semiconductor region 120, the stressor layer 160 can be made so as to apply a compressive or a tensile stress to the channel region. In one example, the magnitude of the stress applied to the channel region can range from about 0.5 GPa and up.

FIG. 9 illustrates a result of forming a further dielectric layer 164 atop the structure. In one embodiment, the dielectric layer 164 consists essentially of undoped silicon glass. Thereafter, as seen in FIG. 10, a process is performed to planarize the structure, such as, for example, by polishing the dielectric layer 164 and dielectric stressor layer 160 by CMP until the first semiconductor feature 140 is exposed at a planarized surface 166 of the resulting dielectric region overlying the semiconductor region major surface 102.

Figure 11:
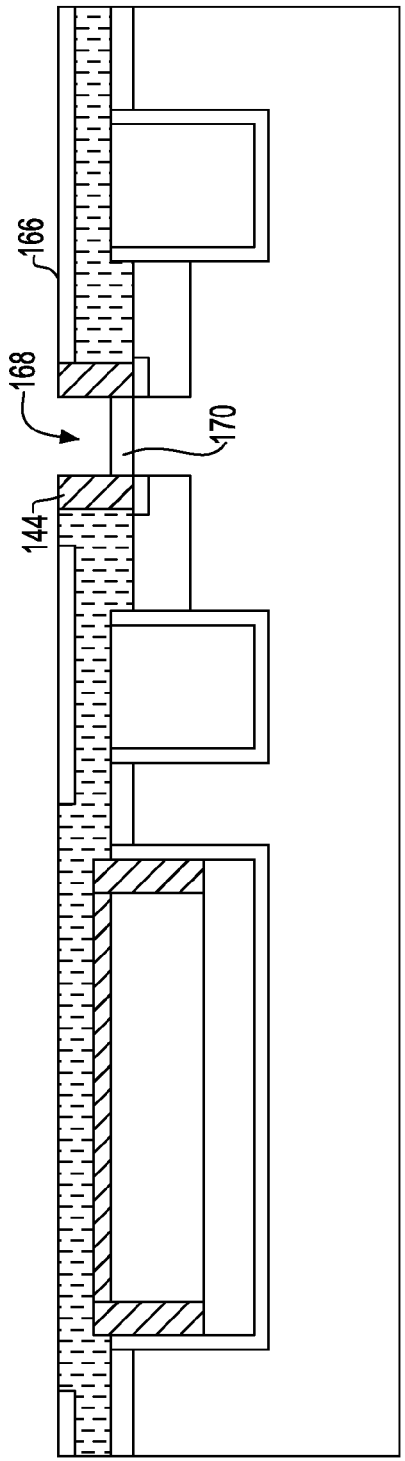
FIG. 11 is a sectional view showing a stage in a fabrication method according to an embodiment of the invention subsequent to the stage of FIG. 10, after removing at least a portion of the first semiconductor region form the structure.

FIG. 11 shows a subsequent stage of fabrication in which at least a portion of the first semiconductor feature exposed at the planarized surface 166 of the dielectric region is removed. This step forms an opening 168 in the dielectric region. In one embodiment, this step can be performed by etching the semiconductor feature selectively with respect to a material of the dielectric region, e.g., silicon nitride, with which the semiconductor feature is in contact at the spacers and selectively with respect to a portion of the oxide layer 170.

Thereafter, further steps are performed by which a gate dielectric layer and a metal gate are formed within the opening 168. In one embodiment, the gate dielectric layer can be one that has a dielectric constant which is higher than silicon nitride or which is at least four, which can be referred to as a high dielectric constant or "high-k" dielectric material. In one embodiment, a portion or all of the oxide layer 170 overlying the major surface 102 can be removed and such high-k gate dielectric can be formed in place of layer 170. Alternatively, a portion of the oxide layer 170 can be allowed to remain and be incorporated in the gate dielectric layer 170.

Figure 12:
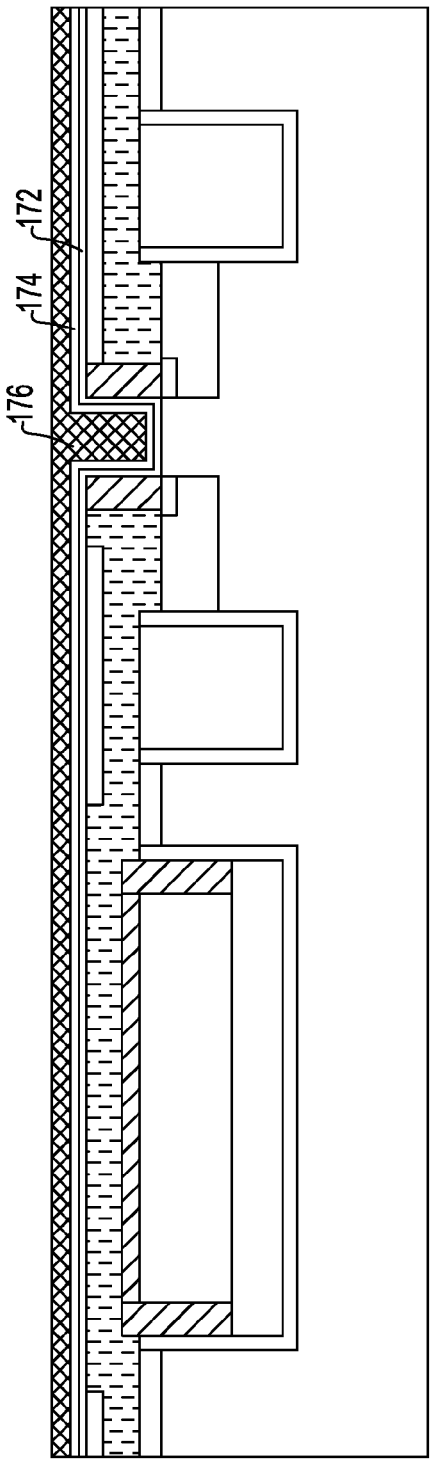
FIG. 12 is a sectional view showing a stage in a fabrication method according to an embodiment of the invention subsequent to the stage of FIG. 11, after depositing a gate dielectric layer and metal gate.

Referring to FIG. 12, in a particular embodiment, the gate dielectric layer 172 can include one or more of the following dielectric materials which have relatively high dielectric constants: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Typically, such gate dielectric layer is deposited by chemical vapor deposition (CVD) or atomic layer deposition (ALD). The gate dielectric layer typically is deposited onto all exposed surfaces, including onto the planarized surface 166 and into opening 168 (FIG. 11) to form layer 172.

Figure 13:
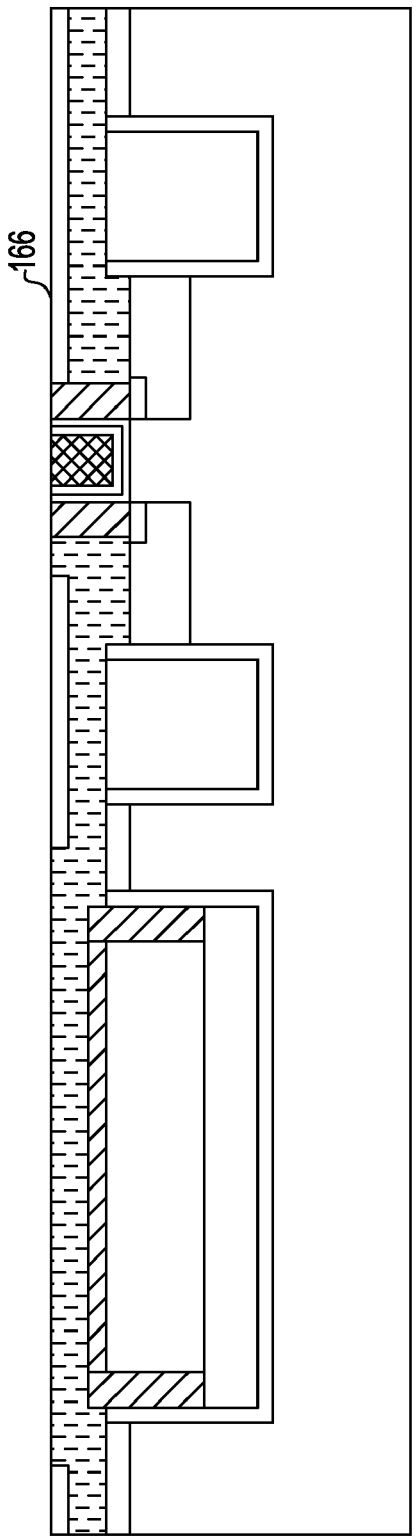
FIG. 13 is a sectional view showing a stage in a fabrication method according to an embodiment of the invention subsequent to the stage of FIG. 12, after polishing the structure until the planarized surface of the dielectric region is exposed.

Thereafter, a workfunction setting layer 174 of metal or metal compound can be deposited to overlie the gate dielectric layer 172. By annealing the structure with such layer 174 thereon, the workfunction or threshold voltage of a microelectronic device, e.g., a field effect transistor, can be established at a desirable level. A layer 176 can be deposited to overlie layer 174 and fill the remaining volume within the opening as seen in FIG. 12. A polishing step can then remove portions of the layers 172, 174, 176 which overlie the planarized surface 166, resulting in a structure as seen in FIG. 13. The processing performed according to FIG. 12 to form a gate dielectric layer and a metal gate typically requires a relatively high thermal budget, because temperatures at which processing is performed usually are rather high, e.g., ranging from about 700° C. and up, and the product of the processing temperature and the amount of time at such temperature can be substantial.

Figure 14:
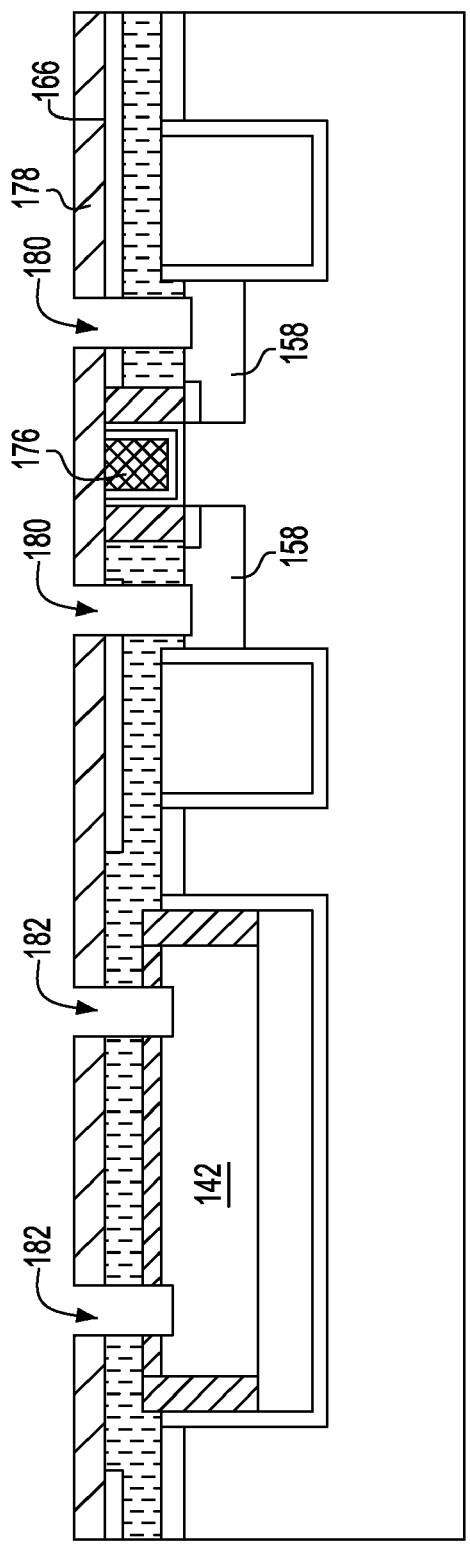
FIG. 14 is a sectional view showing a stage in a fabrication method according to an embodiment of the invention subsequent to the stage of FIG. 13, after forming a dielectric layer overlying the planarized surface and forming apertures therein which extend to device regions and portions of the second semiconductor feature.

FIG. 14 illustrates a subsequent stage of fabrication after another dielectric layer 178 is formed overlying the planarized surface 166, which can be a layer of silicon nitride, for example. Thereafter, apertures 180, 182 are formed which extend through the dielectric region to expose portions of the device regions (e.g., source/drain regions 158) and portions of the semiconductor region 142, respectively. Another aperture can be formed at this time which extends through the dielectric region to the gate 176. However, such aperture can be formed at a location which is out of the plane illustrated in the particular sectional view of FIG. 14, and thus, is not visible in FIG. 14.

Figure 15:
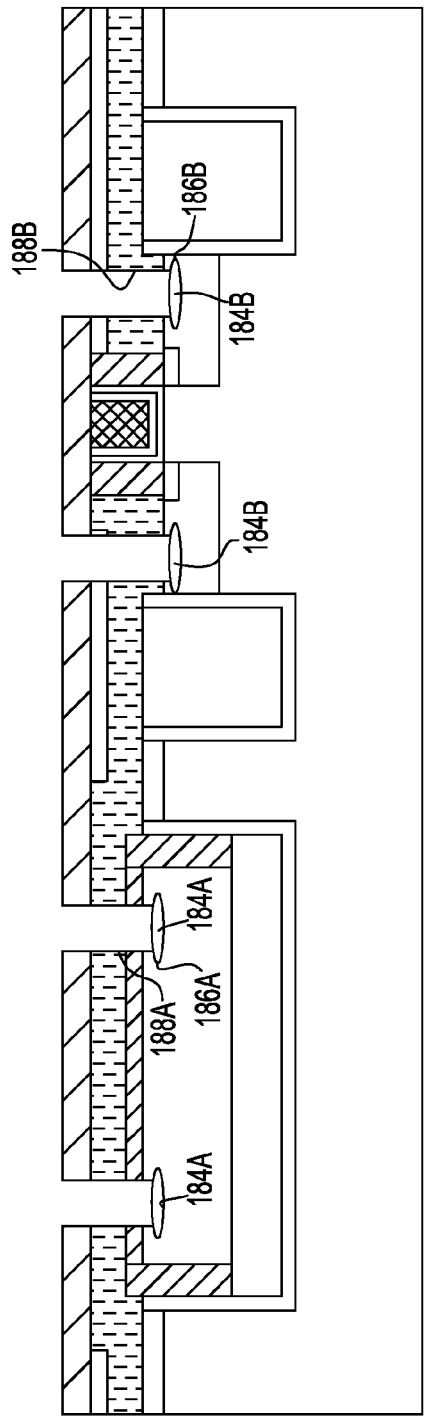
FIG. 15 is a sectional view showing a stage in a fabrication method according to an embodiment of the invention subsequent to the stage of FIG. 14, in which silicide regions are formed at interfaces to the device regions and portions of the second semiconductor region.

Then, as seen in FIG. 15, silicide regions 184A, 184B are formed whose locations are determined in accordance with the locations of the apertures 182, 180, respectively. For example, edges 186A, 186B of the silicide regions are defined in accordance with edges 188A, 188B of the apertures adjacent to such edges. Thus, in one example, the silicide regions can be formed by a self-aligned process of depositing a metal or a metal compound within the apertures in the dielectric region, heating the substrate to cause the metal or metal compound within the apertures to react with the semiconductor material of the semiconductor feature and the device regions, and then removing the unreacted metal from at least some portions of the substrate.

Referring again to FIG. 12, the processing performed according to FIG. 12 to form a gate dielectric layer and a metal gate can require a relatively high thermal budget. The thermal budget required to perform such processing may be greater than the thermal budget that the silicide regions 184A, 184B can withstand. Accordingly, the above-described step (FIG. 15) of forming the silicide regions 184A, 184B on exposed surfaces of a semiconductor feature and device regions within the apertures 182, 180 after forming the gate dielectric and metal gate can be one way of addressing the limitations on thermal budget of the silicide regions.

Figure 16:
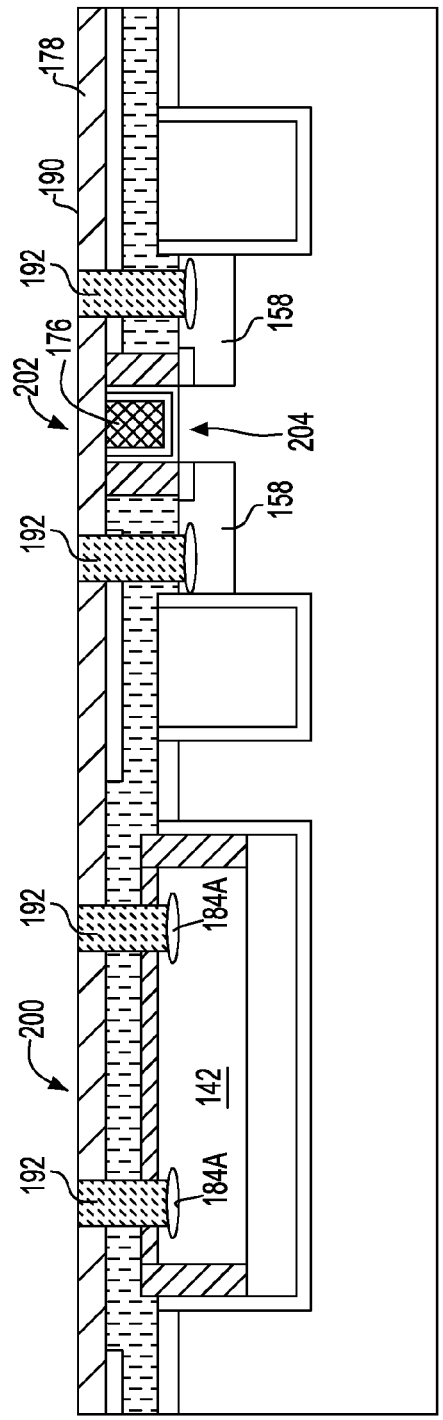
FIG. 16 is a sectional view showing a stage in a fabrication method according to an embodiment of the invention subsequent to the stage of FIG. 15, in which the apertures are filled with at least one of a metal or conductive metal compound to form electrically conductive contacts to the device regions and the second semiconductor region.

FIG. 16 illustrates a subsequent stage of fabrication in which the apertures are filled with at least one of a metal or a conductive metal compound in forming electrically conductive contacts 192. For example, a layer of tungsten, titanium, a conductive compound of tungsten or titanium, or a combination thereof can be deposited into the apertures and onto an exposed surface 190 of the dielectric layer 178. Then, a subsequent step can remove deposited conductive material which overlies the surface 190. In a particular embodiment, the conductive contacts 192, including the silicide regions 184A, can electrically contact spaced apart portions of the semiconductor feature 142 so as to define a resistor between the conductive contacts 192. In a particular embodiment, the performance of this step can include depositing tungsten within the apertures and onto the surface 190, followed by performing CMP to remove the deposited tungsten which overlies the surface 190 of the dielectric layer 178. In one example, the CMP step can be performed selectively with respect to a material, e.g., silicon nitride, of which the dielectric layer 178 is made.

The completion of the conductive contacts 192 completes a semiconductor resistor 200 defined by the electrically conductive contacts 192 (including the silicide regions 184A) and at least a portion of the semiconductor feature 142 between the contacts 192. In addition, the completion of the conductive contacts 192 completes a microelectronic device 202, for example, a field effect transistor, which includes the gate 176, and device regions including the source/drain regions 158 and a channel region 204 between the source/drain regions.

Figure 17:
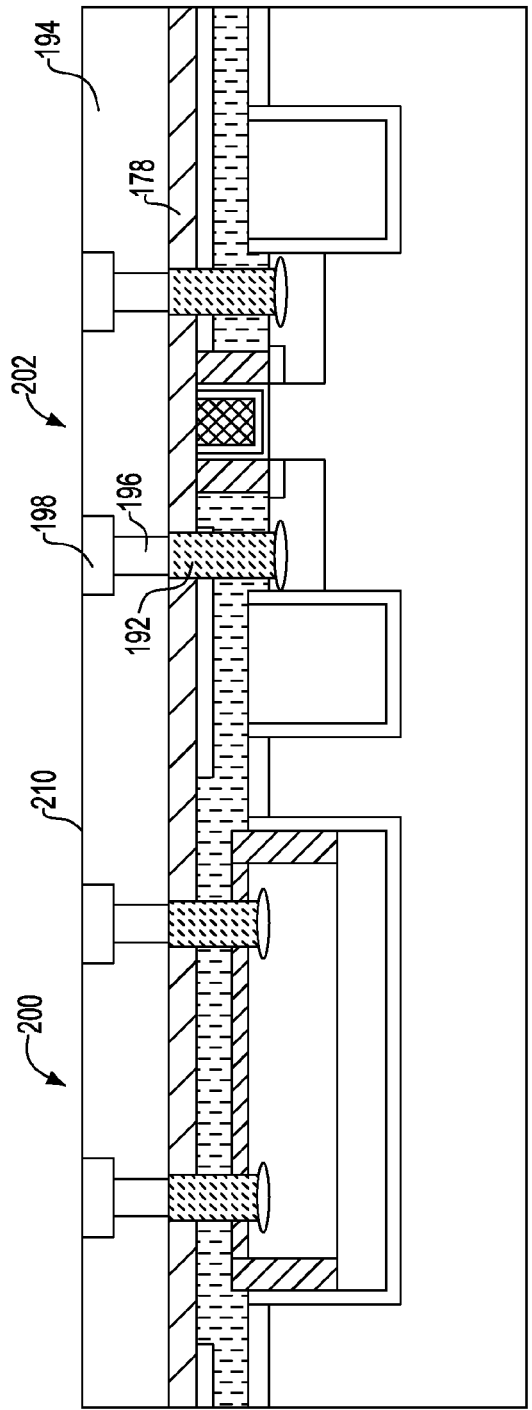
FIG. 17 is a sectional view showing a stage in a fabrication method according to an embodiment of the invention subsequent to the stage of FIG. 16, in which a further dielectric layer is formed and electrically conductive vias and wiring patterns are formed therein.

FIG. 17 illustrates a further fabrication step of forming a dielectric layer 194 above the dielectric layer 178, typically an interlevel dielectric (ILD) layer, and then forming electrically conductive vias 196 which extend through the dielectric layer to the conductive contacts 192, and wiring patterns 198 extending from the vias 196. Typically, the vias and wiring patterns are formed of metal. The wiring patterns 198 can extend in directions parallel to a plane defined by the major surface 210 of the dielectric layer 178 to interconnect the resistor 200 and the microelectronic device 202, e.g., field effect transistor with other active or passive devices formed on the microelectronic element. Further electrically interconnection between devices can be provided by additional electrically conductive vias and wiring patterns (not shown) provided in one or more ILD layers (not shown) overlying the ILD layer 194.

Figure 18:
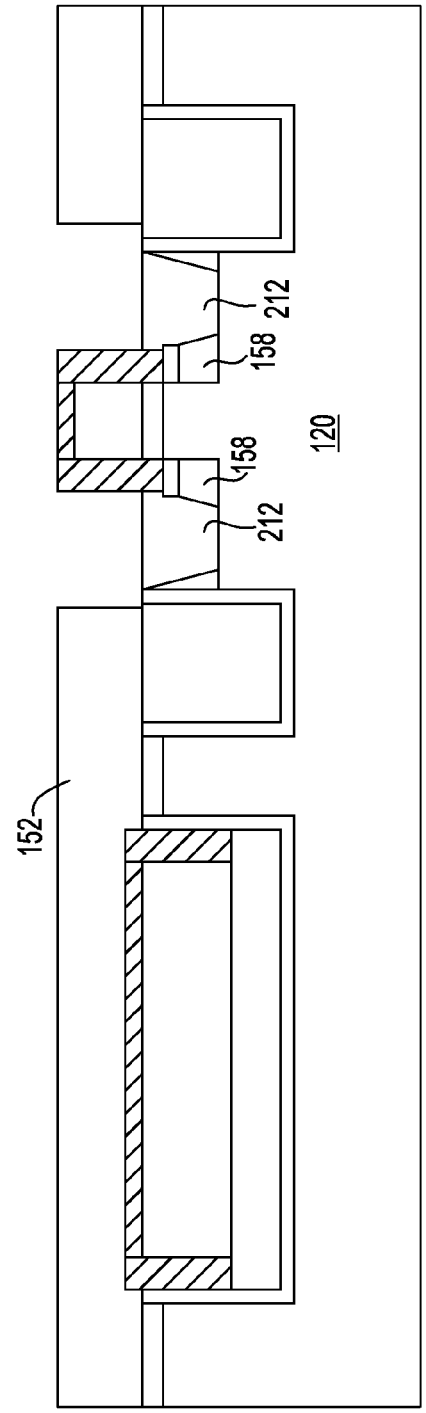
FIG. 18 is a sectional view showing a stage in a variation of the fabrication method shown in FIGS. 1-17 in which semiconductor stressor regions are formed in portions of device regions of the substrate or in areas in which device regions will be formed.
Figure 19:
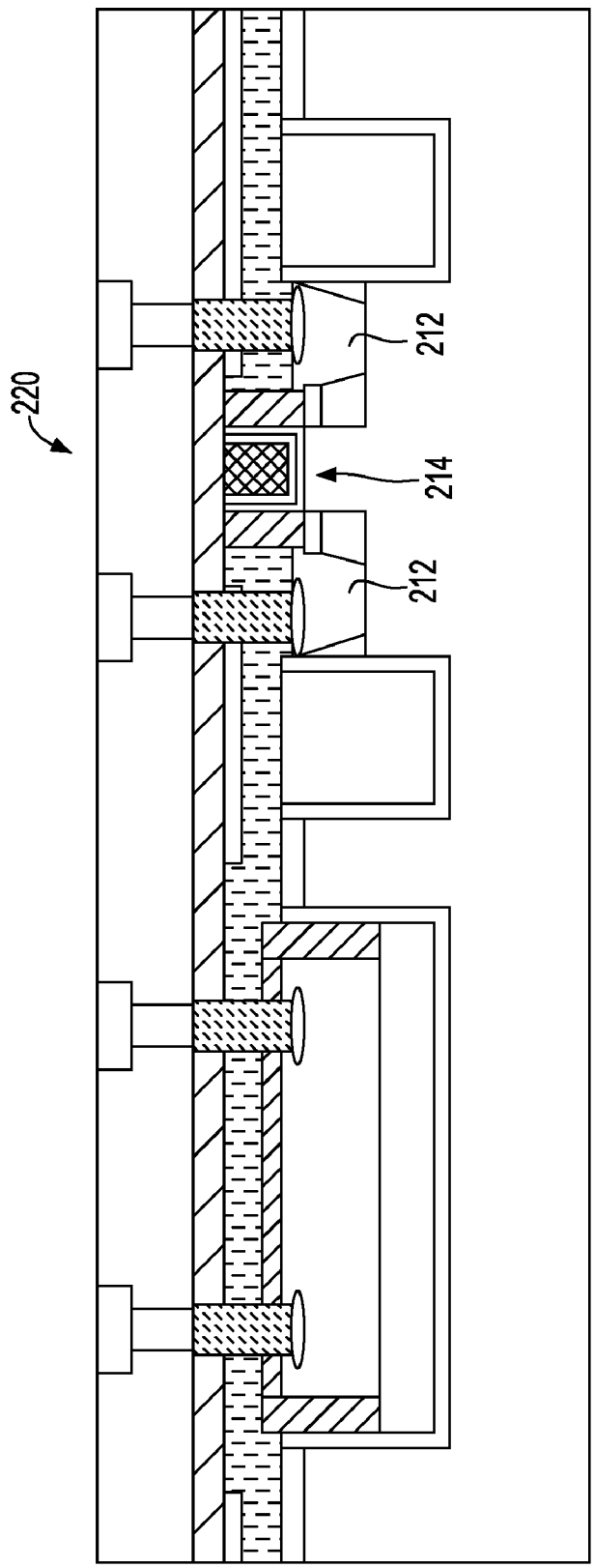
FIG. 19 is a sectional view showing a completion stage in the fabrication method according to the same variation of the embodiment as shown in FIG. 18.

FIG. 18 illustrates a stage in a fabrication method according to a variation of the above-described embodiment which includes forming semiconductor stressor regions 212 within the source/drain regions 158. The stressor regions 212 apply a beneficial stress to a channel region of the microelectronic device, e.g., field effect transistor, to be formed between the source/drain regions 158. Steps to form the semiconductor stressor regions can include etching the monocrystalline semiconductor region 120 through openings mask 152 to form recesses, and then epitaxially growing the stressor regions on the monocrystalline semiconductor material exposed within the recesses. FIG. 19 illustrates the structure including a completed microelectronic device 220 formed according to this embodiment. When the microelectronic device is a p-type field effect transistor ("PFET"), and the monocrystalline semiconductor region consists essentially of silicon, stressor regions 212 formed by epitaxially growing an alloy of silicon such as silicon germanium can apply a beneficial compressive stress to the channel region 214 of the PFET. Alternatively, When the microelectronic device is an n-type field effect transistor ("NFET"), and the monocrystalline semiconductor region consists essentially of silicon, stressor regions 212 formed by epitaxially growing an alloy of silicon such as silicon carbon can apply a beneficial tensile stress to the channel region of the NFET.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of fabricating a microelectronic device and a resistor on a substrate, comprising:
   (a) forming device regions in a monocrystalline semiconductor region of a substrate, the device regions having edges defined according to a first semiconductor feature overlying a major surface of the semiconductor region;
   (b) forming a dielectric region having a planarized surface overlying the semiconductor region and overlying a second semiconductor feature disposed above a surface of an isolation region in the substrate, the isolation region surface being disposed below the major surface;
   (c) removing at least a portion of the first semiconductor feature exposed at the planarized surface of the dielectric region to form an opening and forming a gate at least partially within the opening; and
   (d) forming electrically conductive contacts extending through apertures in the dielectric region to the second semiconductor feature and the device regions, respectively, including forming silicide regions contacting portions of the second semiconductor feature and the device regions, respectively, to define a resistor having a current path through the second semiconductor feature, and a microelectronic device including the gate and the device regions.

2. The method as claimed in claim 1, wherein the step of forming the silicide regions in step (d) has a maximum thermal budget which is lower than the thermal budget required for forming the gate in step (c).

3. The method as claimed in claim 2, wherein the step of forming the conductive contacts to the second semiconductor feature includes forming the apertures and then forming the silicide regions by depositing and reacting a metal with portions of the second semiconductor feature exposed within the apertures.

4. The method as claimed in claim 2, wherein the step of forming the conductive contacts includes depositing a metal within the apertures after forming the silicide regions.

5. The method as claimed in claim 1, wherein during step (a) the first semiconductor feature is separated from the semiconductor region by a dielectric layer, and step (c) includes removing the at least a portion of the first semiconductor feature to expose the dielectric layer within the opening.

6. The method as claimed in claim 5, wherein the step of removing the at least a portion of the first semiconductor feature in step (d) includes etching the first semiconductor feature selectively relative to a material of the dielectric region.

7. The method as claimed in claim 6, wherein step (c) includes forming a gate dielectric layer within the opening, the gate dielectric layer having a dielectric constant of at least four.

8. The method as claimed in claim 7, wherein the forming of the gate in step (c) includes forming a metal gate within the opening.

9. The method as claimed in claim 1, wherein the dielectric region is a first dielectric region, the method further comprising, prior to step (d), forming a second dielectric region overlying the first dielectric region and the gate, wherein the step of forming the conductive contacts includes forming the apertures to extend through the second dielectric region, at least some of the apertures extending through the first dielectric region.

10. The method as claimed in claim 1, further comprising, prior to step (a), patterning a semiconductor layer overlying a major surface of a semiconductor region and the isolation region to define the first and second semiconductor features having the same thickness from the major surface and from a surface of the isolation region, respectively.

11. The method as claimed in claim 10, further comprising, forming the isolation region in the substrate, and then forming the semiconductor layer by an in situ doping process, wherein the step of patterning the semiconductor layer is performed by a dry etching process, such that a desired dopant concentration of the resistor can be established without needing to selectively implant a dopant therein using a mask.

12. The method as claimed in claim 11, further comprising, prior to patterning the semiconductor layer, forming the isolation region by simultaneously forming a plurality of isolation regions in the substrate and then selectively recessing an isolation region of the plurality of isolation regions so that the surface of the isolation region is disposed below the major surface of the semiconductor region, wherein portions of the semiconductor region are separated from one another by the plurality of isolation regions.

13. A method of fabricating a field effect transistor and a resistor on a substrate, comprising:
   (a) etching an isolation region exposed at a surface of a monocrystalline semiconductor region of a substrate to cause the isolation region to lie below the surface;
   (b) depositing a semiconductor layer overlying the surface and overlying the isolation region;
   (c) patterning the semiconductor layer to form a first semiconductor feature overlying the surface and a second semiconductor feature overlying the isolation region;
   (d) forming source/drain regions in the semiconductor region, the source/drain regions having edges defined according to the first semiconductor feature;
   (e) forming a first dielectric region having an at least substantially planar surface overlying the semiconductor region and overlying the second semiconductor feature;
   (f) removing at least a portion of the first semiconductor feature exposed at the substantially planar surface to form an opening;
   (g) forming a gate dielectric layer having a dielectric constant greater than four within the opening and forming a metal gate overlying the gate dielectric layer;
   (h) forming a second dielectric region overlying the first dielectric region and the metal gate; and (i) then forming electrically conductive contacts extending through apertures in the first and second dielectric regions to the source/drain regions and the second semiconductor feature, respectively, including forming silicide regions contacting the source/drain regions and portions of the second semiconductor feature, respectively, to define a field effect transistor including the metal gate, the source/drain regions and a channel below the metal gate, and a resistor having a current path through the second semiconductor feature.

14. The method as claimed in claim 13, wherein the forming of the first dielectric region in step (e) includes forming a dielectric stressor layer overlying at least the first semiconductor feature, forming a dielectric layer overlying the dielectric stressor layer and then polishing until a surface of the dielectric region becomes at least substantially planar and the first semiconductor feature is exposed at the at least substantially planar surface.

15. The method as claimed in claim 14, wherein the forming of the source/drain regions in step (d) includes forming dielectric spacers on edge surfaces of the first semiconductor feature, forming extension regions, forming recesses in the semiconductor region adjacent the first semiconductor region, and forming stressed semiconductor regions extending within the recesses.

16. The method as claimed in claim 15, wherein the step of forming the silicide regions in step (i) has a maximum thermal budget lower than the thermal budget required for forming the gate dielectric and the metal gate in step (g).

17. The method as claimed in claim 16, wherein the step of forming the conductive contacts to the second semiconductor feature includes forming the apertures and then forming the silicide regions by depositing and reacting a metal with portions of the second semiconductor feature exposed within the apertures.

18. The method as claimed in claim 17, wherein the step of forming the conductive contacts includes depositing a metal within the apertures after forming the silicide regions.

19. The method as claimed in claim 18, wherein during step (d) the first semiconductor feature is separated from the semiconductor region by a dielectric layer, and step (f) includes removing the at least a portion of the first semiconductor feature to expose the dielectric layer within the opening.

20. A microelectronic element, comprising:
a substrate having a monocrystalline semiconductor region having a major surface and an isolation region separating portions of the semiconductor region exposed at the major surface from one another, the isolation region having a top surface disposed below the major surface;
a semiconductor feature overlying the top surface of the isolation region;
a first dielectric region having an at least substantially planar surface overlying the isolation region and having an opening extending from the at least substantially planar surface, the opening overlying the semiconductor region;
a gate dielectric layer and a metal gate disposed within the opening;
source/drain regions disposed in the semiconductor region adjacent the metal gate;
a second dielectric region overlying the first dielectric region; and
electrically conductive contacts extending through apertures in the first and second dielectric regions to the semiconductor feature and the source/drain regions, the conductive contacts including silicide regions contacting the source/drain regions and contacting the semiconductor feature, respectively, the silicide regions having edges defined by edges of the apertures, wherein the semiconductor feature defines a resistor, and the metal gate, the source/drain regions and a channel portion of the semiconductor region below the metal gate define a field effect transistor.

* * * * *